United States Patent
Kim et al.

(10) Patent No.: US 7,008,844 B2
(45) Date of Patent: Mar. 7, 2006

(54) METHOD OF FORMING A GATE OF A NON-VOLATILE MEMORY DEVICE

(75) Inventors: Bong-Hyun Kim, Incheon (KR); Hun-Hyeoung Lim, Gyeonggi-do (KR); Hyeon-Deok Lee, Seoul (KR); Yong-Woo Hyung, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/635,969

(22) Filed: Aug. 6, 2003

(65) Prior Publication Data

US 2004/0033653 A1    Feb. 19, 2004

(30) Foreign Application Priority Data

Aug. 19, 2002   (KR) ................ 2002-48981

(51) Int. Cl.
    *H01L 21/336* (2006.01)
(52) U.S. Cl. ............... 438/257; 438/663; 438/198
(58) Field of Classification Search ........ 438/259
    See application file for complete search history.

(56) References Cited

U.S. PATENT DOCUMENTS

| | | | | | |
|---|---|---|---|---|---|
| 5,045,488 | A | * | 9/1991 | Yeh ............................ | 438/257 |
| 5,943,592 | A | * | 8/1999 | Tsukamoto et al. ......... | 438/486 |
| 6,117,756 | A | * | 9/2000 | Wu ............................. | 438/594 |
| 6,316,316 | B1 | * | 11/2001 | Wu ............................. | 438/260 |
| 6,380,029 | B1 | * | 4/2002 | Chang et al. ............... | 438/257 |
| 6,413,805 | B1 | * | 7/2002 | Zhang et al. ............... | 438/166 |
| 6,597,014 | B1 | * | 7/2003 | Yamazaki et al. .......... | 257/59 |

FOREIGN PATENT DOCUMENTS

| | | |
|---|---|---|
| JP | 2001-53171 | 2/2001 |
| KR | 2000-42639 | 7/2000 |
| KR | 2001-0004262 | 1/2001 |
| KR | 2001-0008614 | 2/2001 |

OTHER PUBLICATIONS

English language of abstract for Korean Patent Publication No. 2000-42639.

* cited by examiner

*Primary Examiner*—Thao P. Le
(74) *Attorney, Agent, or Firm*—Marger Johnson & McCollom, P.C.

(57) ABSTRACT

A tunnel dielectric layer is formed on a semiconductor device. A floating gate layer is formed on the tunnel dielectric layer. An intergate dielectric layer (ONO layer) is formed on the floating gate layer. An in-situ doped silicon is deposited on the intergate dielectric layer to form a control gate layer and then, an annealing is carried out. The control gate layer, the intergate dielectric layer, and the floating gate layer are patterned through a photolithographic process. The phase transformation of the control gate silicon layer does not occur during a subsequent gate oxidation process to reduce the thickness variation of the ONO layer, thereby improving endurance and bake retention characteristics of the semiconductor device.

11 Claims, 7 Drawing Sheets

METHOD OF FORMING A GATE OF A NON-VOLATILE MEMORY DEVICE

CROSS REFERENCE TO RELATED APPLICATIONS

This application claims priority from Korean Patent Application No. 2002-48981, filed on Aug. 19, 2002, the contents of which are incorporated herein by reference in their entirety.

BACKGROUND OF THE INVENTION

1. Field of the Invention

The present invention relates to a method for manufacturing a semiconductor device, and, more particularly, to a method of forming a gate in a non-volatile memory device.

2. Description of the Related Art

Semiconductor memory devices are generally divided into a random access memory (RAM) such as a dynamic random access memory (DRAM) or a static random access memory (SRAM) which is referred to as volatile memory because the data stored on the cell is destroyed if the power is interrupted and a read only memory (ROM) which is referred to as non-volatile memory because the stored data on the cell is retained even when the power is temporarily interrupted.

Because the non-volatile memory device can store data for an unlimited time, there is an increased demand on a flash memory device such as electrically erasable and programmable ROM (EEPROM) capable of inputting and outputting data electrically. Memory cells of these devices generally have a vertical stack gate structure comprising a floating gate formed on a silicon substrate with a tunnel oxide layer disposed therebetween. Further, the stack gate structure includes a control gate over and/or around the floating gate with an intergate dielectric layer disposed therebetween. In the flash memory cell having this structure, a programming operation is accomplished by forming channel hot electrons on the drain side to accumulate the electrons in the floating gate, thereby increasing a threshold voltage (Vth) of a cell transistor. An erasing operation is performed by generating a high voltage between the substrate and the floating gate to discharge the electrons accumulated in the floating gate, thereby lowering the threshold voltage (Vth) of the cell transistor.

The floating gate affects the charge characteristics of the tunnel oxide layer during the programming and/or erasing of data and is typically formed of a doped polysilicon layer.

The intergate dielectric layer maintains charges stored in the floating gate and typically comprises an ONO layer formed by stacking a lower oxide film, a nitride film and an upper oxide film.

The control gate is a layer to which a voltage is applied to transfer electrons of the substrate to the floating gate or electrons in the floating gate to the substrate during the programming or erasing operation. The control gate is typically formed of a polycide structure having a polysilicon layer and a metal silicide layer stacked on the polysilicon layer to reduce resistance.

Generally, a polysilicon film used for the control gate is deposited at a crystalline phase at a temperature of about 620° C. and subsequently doped with a high concentration N-type impurity by $POCl_3$ diffusion or ion implantation. However, where the $POCl_3$ diffusion progresses with a high concentration ($1E21/cm^3$), the morphology of the polysilicon film becomes poor because the polysilicon film is subject to the doping process for a long time at a high temperature of about 850° C.

On the contrary, where the $POCl_3$ diffusion progresses with a low concentration ($1E19\sim1E20/cm^3$), a depletion layer in the polysilicon film increases, lowering the program speed. Furthermore, the grains in the polysilicon film have various sizes such that a bird's beak extends to a central portion of the ONO layer during a subsequent gate oxidation process for curing damage to the sidewalls of the ONO layer. Thus, as shown in the following table 1, the thickness variation of the ONO layer severely deteriorates the endurance and bake-retention characteristics of the non-volatile memory device. The endurance (i.e., the number of times in which program and erase operations can be repeated) represents a Vth variation of the cell transistor with respect to program-erase cycle and the bake-retention represents a Vth variation of the cell transistor measured after baking at a temperature of about 250° C.

TABLE 1

|  | Thickness, left side | Thickness, center | Thickness, right side | Thickness variation |
| --- | --- | --- | --- | --- |
| Upper oxide | 78 Å | 48 Å | 64 Å | 30 Å |
| Nitride flim | 41 Å | 48 Å | 46 Å | 7 Å |
| Lower oxide | 55 Å | 53 Å | 70 Å | 17 Å |

As shown in the table 1, the bird's beak phenomenon is most severe at the interface between the ONO layer and the control gate polysilicon layer. The control_gate polysilicon layer is typically formed by depositing undoped polysilicon and the subsequent $POCl_3$ doping. This prior art method increases the thickness variation of the upper oxide film in contact with the control gate polysilicon layer.

To address this problem, the control gate is formed of in-situ doped polysilicon capable of easily controlling the doping level. Examples of this method are disclosed in Korean Patent Laid-Open Publication No. 2001-8614, Korean Patent Laid-Open Publication No. 2001-4262, and Japanese Patent Laid-Open Publication No. 2001-53171. Particularly, Korean Patent Laid-Open Publication No. 2001-8614 discloses a method of performing an annealing process after patterning the stacked gate structure including the control gate comprising an in-situ doped polysilicon.

If the in-situ doped polysilicon control gate is employed, the depletion layer in the polysilicon film is suppressed to a thickness of about 6 Å, thereby increasing the program speed. However, although this initially deposited in-situ doped polysilicon film is amorphous, the amorphous polysilicon film becomes crystallized (phase transformation) during a gate oxidation process performed after the gate patterning process. Accordingly, the thickness variation of the ONO layer caused by the bird's beak phenomenon is severe with the above described prior art method, thus deteriorating the reliability of the ONO layer and in turn degrading the endurance and the bake-retention characteristics of the non-volatile memory device.

Figure 1A:
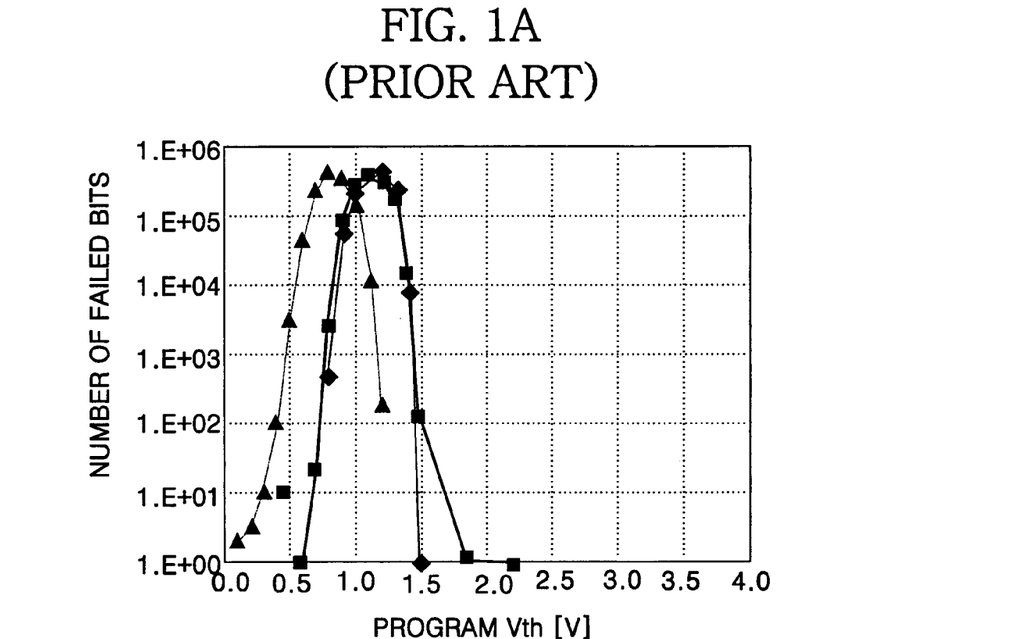
FIG. 1A is a graph showing the bake retention characteristics of a non-volatile memory device manufactured according to a first conventional method.
Figure 1B:
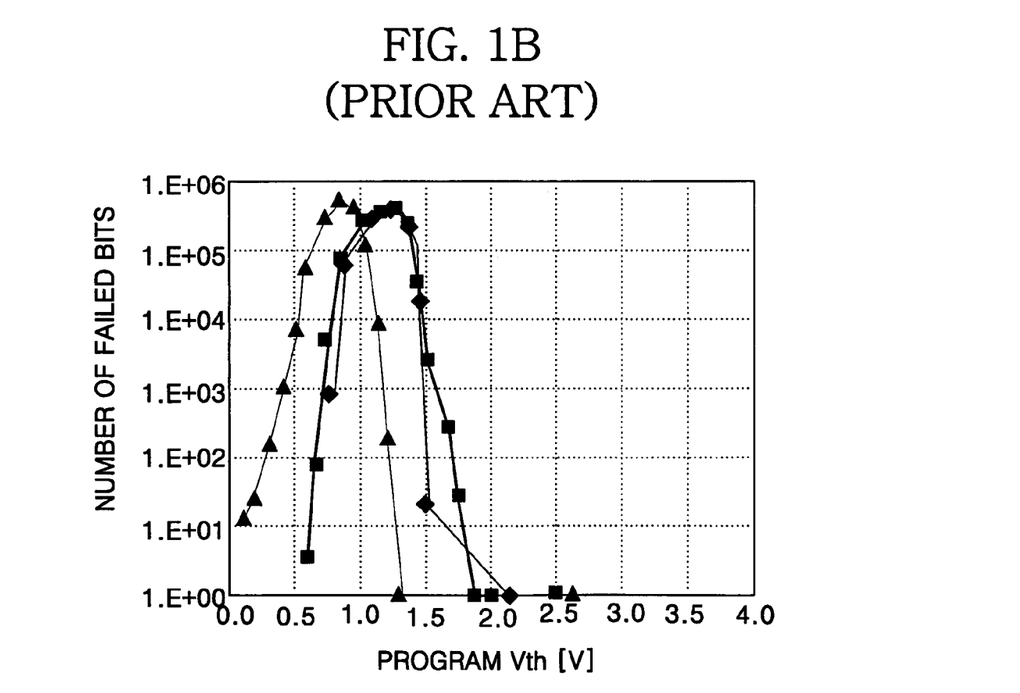
FIG. 1B is a graph showing the bake retention characteristics of a non-volatile memory device manufactured according to a second conventional method.

FIG. 1A shows the bake retention characteristic according to a first conventional method where $POCl_3$ doping is performed after depositing the undoped polysilicon. FIG. 1B shows the bake-retention characteristic according to the second conventional method of forming the control gate including using the in-situ doped polysilicon.

In the graphs, a graph shown by a symbol ♦ shows the variation of the program threshold voltage Vth with respect to the program-erase operation after 1 cycle. A graph shown by a symbol ■ shows the variation of the program threshold voltage Vth with respect to the program-erase operation after 10000 cycles. A graph shown by a symbol ▲ shows the variation of the program threshold voltage Vth after the baking process. The horizontal axis indicates a program threshold voltage Vth and the vertical axis indicates the number of failed bits.

Referring to FIGS. 1A and 1B, in the second conventional method, the thickness variation of the ONO layer caused by the gate oxidation process is severe because the silicon bonds of amorphous phase are more unstable than the silicon bonds of crystalline phase and, thus, easily oxidized. Therefore, as compared with the first conventional method, the program threshold voltage Vth distribution and the range of fluctuation in the program threshold voltage Vth after baking increase in the second conventional method.

With the control gate comprising in-situ doped polysilicon, a depletion layer in a polysilicon film can be suppressed and the program speed can be increased. However, the reliability of the ONO layer deteriorates, thus degrading the endurance and bake retention characteristics.

Accordingly, a need still remains for a method for fabricating a gate structure in a non-volatile memory device without having the problems described above.

SUMMARY OF THE INVENTION

The present invention provides methods for manufacturing gate structures in a non-volatile memory device capable of controlling a doping level, in which a depletion layer is suppressed and the endurance and bake retention characteristics can be improved.

According to an embodiment of the invention, a tunnel dielectric layer is formed on a semiconductor substrate and a floating gate layer is formed on the tunnel dielectric layer. An intergate dielectric layer is formed on the floating gate layer. An in-situ doped silicon is deposited on the intergate dielectric layer to form a control gate layer. Subsequently, the control gate layer is annealed. The control gate layer, the intergate dielectric layer and the floating gate layer are patterned, using a photolithographic process.

According to another embodiment of the invention, a tunnel dielectric layer is formed on a semiconductor substrate and a first silicon layer as a floating gate layer is formed on the tunnel dielectric layer. An ONO layer as an intergate dielectric layer is formed on the first silicon layer. A second silicon layer as a control gate layer is formed on the ONO layer. A metal silicide layer is formed on the second silicon layer. An annealing process is performed on the resultant structure. The metal silicide layer, the second silicon layer, the ONO layer and the first silicon layer are patterned.

BRIEF DESCRIPTION OF THE DRAWINGS

Features and advantages of the invention will become readily apparent by reference to the following detailed description when considered in conjunction with the accompanying drawings.

DETAILED DESCRIPTION OF THE PREFERRED EMBODIMENTS

Hereinafter, the preferred embodiments of the invention will be described in detail with reference to the accompanying drawings.

Figure 2A:
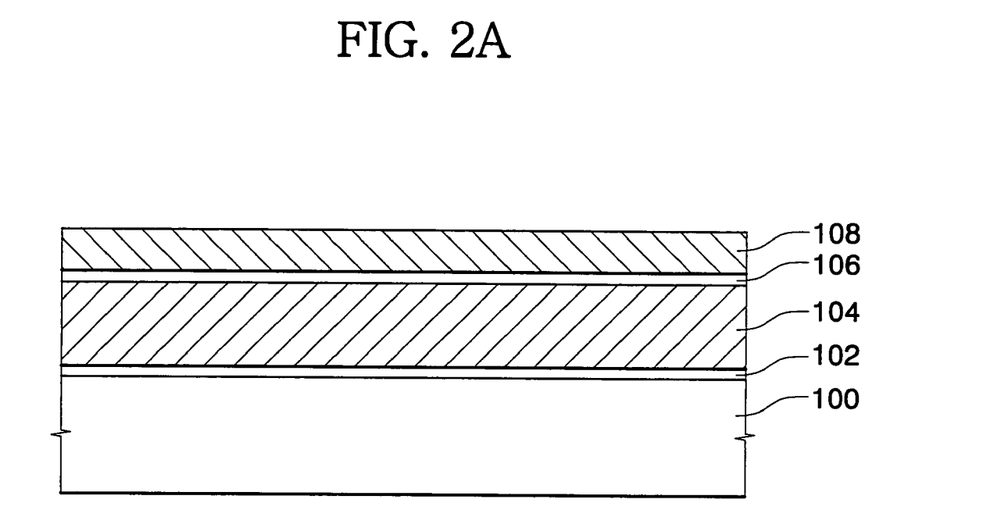
FIGS. 2A to 2C are cross-sectional views illustrating a method of forming a gate in a non-volatile memory device according to a preferred embodiment of the invention.
Figure 2B:
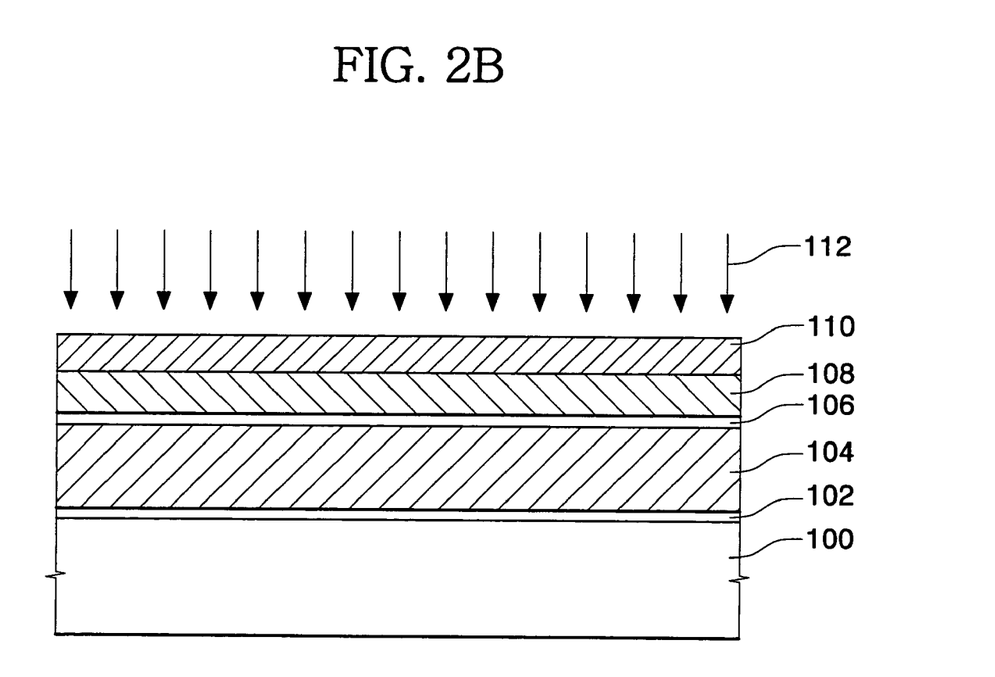
Figure 2C:
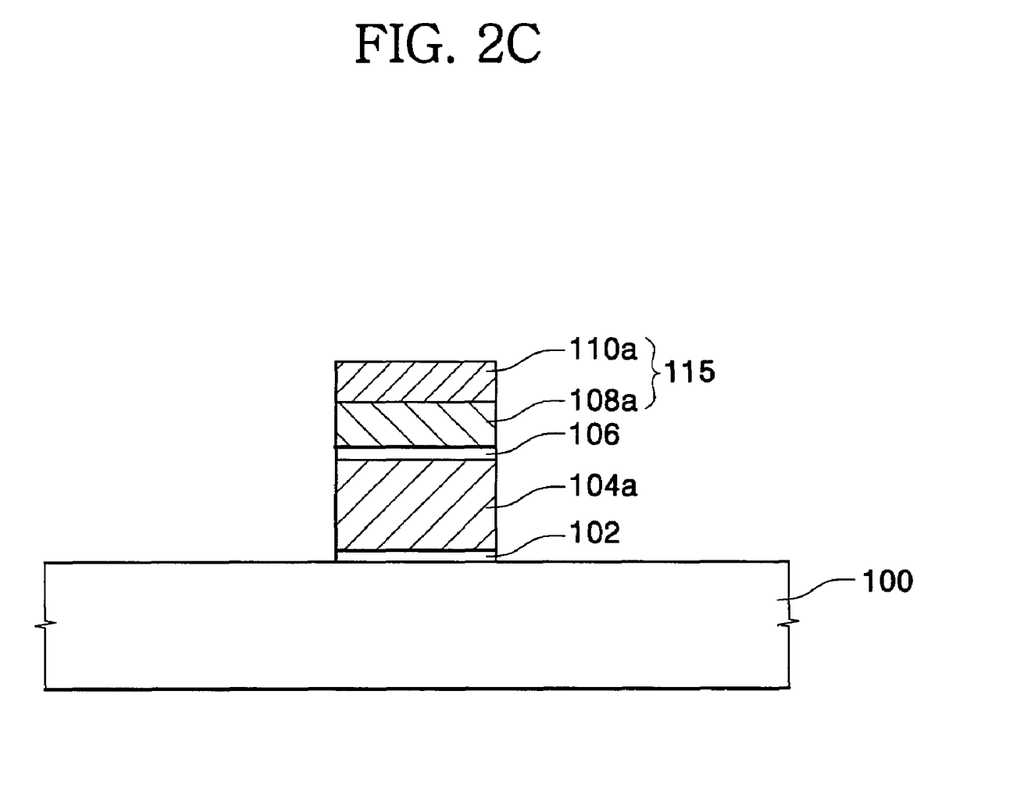

FIGS. 2A to 2C are cross-sectional views illustrating a method of forming a gate in a non-volatile memory device according to a preferred embodiment of the invention.

Referring to FIG. 2A, a semiconductor substrate 100 is divided into an active region and a field region by an isolation process such as shallow trench isolation (STI). In detail, after etching the semiconductor substrate 100 to a predetermined depth to form a trench therein, an oxide layer is deposited on the resulting structure to fill up the trench, for example, by a chemical vapor deposition (CVD) method. Next, the CVD-oxide layer is planarized through an etch-back process or a chemical mechanical polishing (CMP) process, thereby forming a field oxide layer only in the trench.

Alternatively, the field region may be formed by a local oxidation of silicon (LOCOS) process, or may be formed by a self-aligned shallow trench isolation (SA-STI) process in which a floating gate and the active region are formed concurrently.

Then, a tunnel dielectric layer 102 is formed on the substrate 100, for example, by a thermal oxidation process. The tunnel dielectric layer 102 may be a silicon dioxide or silicon oxynitride layer.

As a floating gate layer, a first silicon layer 104 is deposited to a thickness of about 1000~1500 Å on the tunnel dielectric layer 102. Preferably, the first silicon layer 104 comprises polysilicon or amorphous silicon. After doping the first silicon layer 104 with high concentration N-type impurity by a typical doping method such as $POCl_3$ diffusion, ion implantation, or in-situ doping, the first silicon layer 104 on the field region is removed through a photolithography process, thereby isolating the floating gates of the neighboring memory cells from each other.

A first oxide layer, a nitride layer and a second oxide layer are sequentially stacked to form an ONO layer 106 as an intergate dielectric layer on the first silicon layer 104 and the substrate 100. The ONO layer 106 is formed through a thermal oxidation process or a CVD process. A person skilled in the art will appreciate that other suitable materials can be used to form the intergate dielectric layer.

As a control gate layer, a second silicon layer 108 including polysilicon or amorphous silicon is deposited to a thickness of about 1,000 Å on the ONO layer 106. Preferably, the second silicon layer 108 is deposited as an amorphous thin film doped in-situ by using, for example, silane (SiH$_4$) and phosphine (PH$_3$) gases.

Referring to FIG. 2B, a metal silicide layer 110 such as tungsten silicide (WSi$_x$), titanium silicide (TiSi$_x$) or tantalum silicide (TaSi$_x$) is deposited to a thickness of about 100~1,500 Å on the second silicon layer 108.

Then, an annealing process is performed on the resultant structure in an ambient including an inert gas 112 such as nitrogen (N$_2$). The annealing process may be performed using a furnace annealing or a rapid thermal annealing (RTA). The furnace annealing may be performed for about 30 minutes at a temperature of about 600 ~950° C., while the RTA may be performed at a temperature of about 800~1100° C.

Due to the annealing process, the in-situ doped second silicon layer 108 is crystallized, i.e., phase-transformed into a crystalline phase from an amorphous phase. Accordingly, when a subsequent gate oxidation process is performed on the second silicon layer 108, which is already crystallized, the formation of the bird's beak can be suppressed at the interface between the second silicon layer 108 and the ONO layer 106, thereby reducing the thickness variation of the ONO layer 106.

If a tungsten silicide (WSi$_x$) layer is deposited using dichlorosilane (DCS; SiH$_2$Cl$_2$) gas after performing the annealing process on the in-situ doped second silicon layer 108, the underlying annealed second silicon layer 108 may be abnormally grown during the deposition of the tungsten silicide layer. Accordingly, it is preferred that the annealing process be performed after depositing the metal silicide layer 110 such as tungsten silicide in order to prevent this problem.

If the annealing process is performed after depositing the metal silicide layer 110 as described above, the grains of the metal silicide layer 110 grow and become crystallized, thereby reducing the resistivity Rs. That is, if the annealing process is performed after depositing the metal silicide layer 110, the resistivity Rs of the metal silicide layer 110 is decreased because the resistivity Rs is directly proportional to the number of boundary lines between grains and inversely proportional to the grain size.

Figure 6:
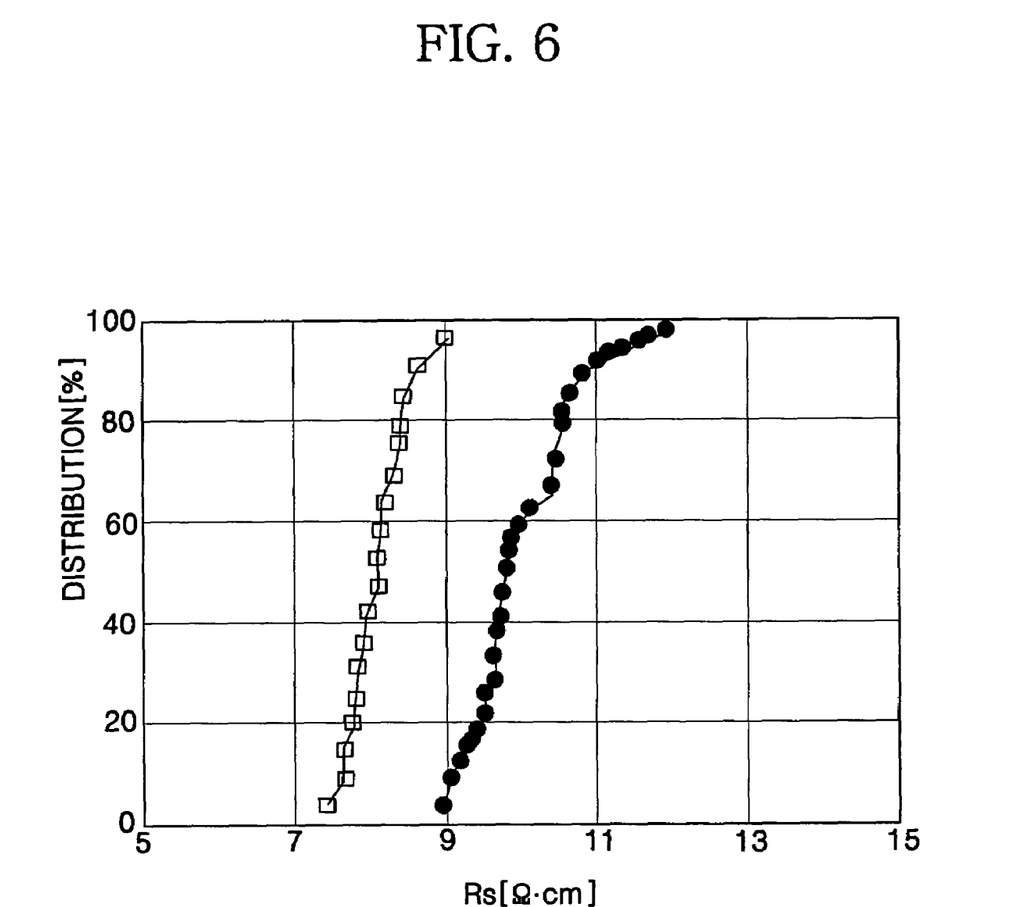
FIG. 6 is a graph showing the resistivity of a tungsten silicide thin film manufactured with and without a subsequent annealing process.

In FIG. 6, a symbol ● indicates the resistivity of the tungsten silicide thin film obtained without performing annealing after depositing the DCS tungsten silicide thin film to a thickness of about 1500 Å. A symbol □ indicates the resistivity of the tungsten silicide thin film obtained with the annealing process for about 30 minutes at a temperature of about 850° C. after the DCS tungsten silicide thin film is deposited to a thickness of about 1500 Å.

Referring to FIG. 2C, the metal silicide layer 110, the second silicon layer 108, the ONO layer 106 and the first silicon layer 104 are sequentially patterned, using conventional etching and photolithographic processes, thereby forming gate stacks comprising the floating gate 104a including the first silicon layer pattern, the control gate 115 including the second silicon layer pattern 108a, and the metal silicide layer pattern 110a.

Prior to performing the photolithographic process, an anti-reflective layer (not shown) including silicon nitride (SiN) or silicon oxynitride (SiON) may be formed on the metal silicide layer 108.

After forming the patterned gate stacks, a gate oxidation process is carried out to cure etching damage to the sidewalls of the ONO layer 106 and also to cure etching damage to the substrate under the edge of the floating gate 104a. As a result, the surface of the substrate 100, the sidewalls of the floating gate 104a and the sidewalls of the control gate 115 are oxidized to form a thin oxide layer (not shown) thereon. During the gate oxidation process, no phase transformation occurs in the second silicon layer pattern 108a of the control gate 115, thereby reducing the thickness variation of the ONO layer 106, which is typically caused by the bird's beak phenomenon.

The following table 2 comparatively illustrates the thickness variation of the ONO layers according to the first conventional method where the un-doped polysilicon is deposited and doped by a POCl$_3$ diffusion process to form the control gate, and an embodiment of the invention where the in-situ doped polysilicon is deposited and annealed to form the control gate.

TABLE 2

|  | Top thickness | Center thickness | Bottom thickness | Thickness variation |
|---|---|---|---|---|
| First conventional method | 78 Å | 48 Å | 64 Å | 30 Å |
| an_embodiment of_the invention | 68 Å | 68 Å | 62 Å | 6 Å |

As shown in the table 2, according to the first conventional method where the un-doped polysilicon is deposited and doped by POCl$_3$ diffusion to form the control gate, the bird's beak is severe at the interface between the ONO layer and the control gate polysilicon layer, so that the thickness variation of the ONO layer increases to about 30 Å.

According to the embodiment of the invention where the in-situ doped polysilicon is deposited and annealed to form the control gate, no phase transformation occurs in the control gate polysilicon layer during the subsequent gate oxidation process, thereby suppressing the formation of the bird's beak. So, the thickness variation of the ONO layer decreases to about 6 Å.

Figure 3:
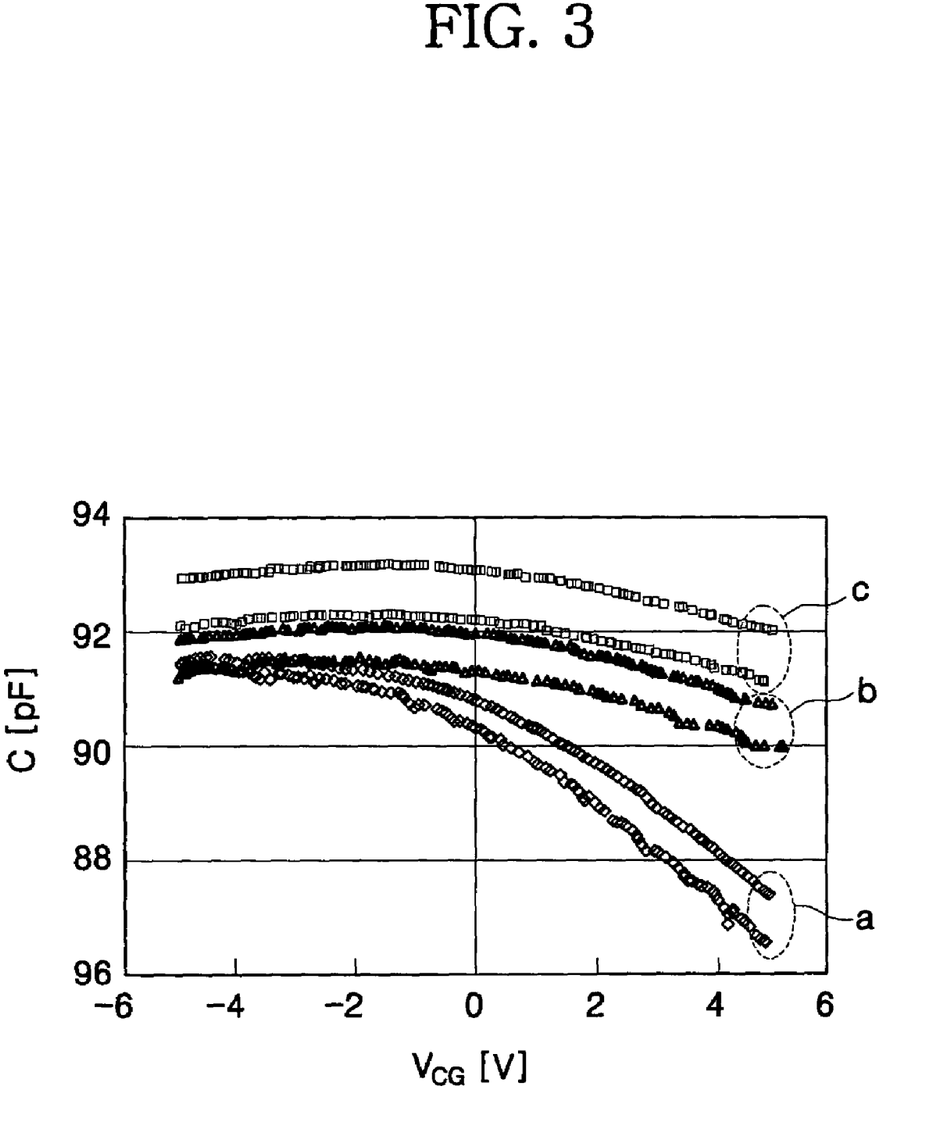
FIG. 3 is a graph comparatively showing capacitance values for the methods of forming a control gate.

FIG. 3 is a graph showing the capacitance values for the methods of forming the control gate. Here, the horizontal axis represents a voltage (V$_{CG}$) applied to the control gate and the vertical axis represents a capacitance. In the drawings, "a" indicates the first conventional method where the un-doped polysilicon is deposited and doped by a POCl$_3$ diffusion process to form the control gate, "b" indicates the second conventional method of depositing the in-situ doped polysilicon to form the control gate, and "c" indicates an embodiment of the invention where the in-situ doped silicon is deposited and annealed to form the control gate. In FIG. 3, an upper line of "a" indicates a capacitance of one wafer selected from one group of wafers having relatively high capacitances while a lower line of "a" indicates a capacitance of another group of wafer selected from another group of wafers having relatively low capacitances. In addition, an upper line of "b" indicates a capacitance of one wafer selected from one group of wafers having relatively high capacitances and a lower line of "b" indicates a capacitance of another wafer selected from another group of wafers having relatively low capacitances. Further, an upper line of "c" indicates a capacitance of one wafer selected from one group of wafers having relatively high capacitances while a lower line of "c" indicates a capacitance of another wafer selected from another group of wafers having relatively low capacitances.

Referring to FIG. 3, the largest depletion layer occurs in the control gate polysilicon layer formed by the first conventional method where the POCl$_3$ doping is performed with a low concentration of 1E19~1E20/cm$^3$ in consideration of the surface morphology of the polysilicon layer.

In contrast, the depletion of the control gate polysilicon layer is suppressed to increase the program speed in the second conventional method and in the embodiment of the invention, which used the in-situ doped polysilicon layer capable of easily controlling the doping level of the phosphine ($PH_3$) gas.

Figure 4A:
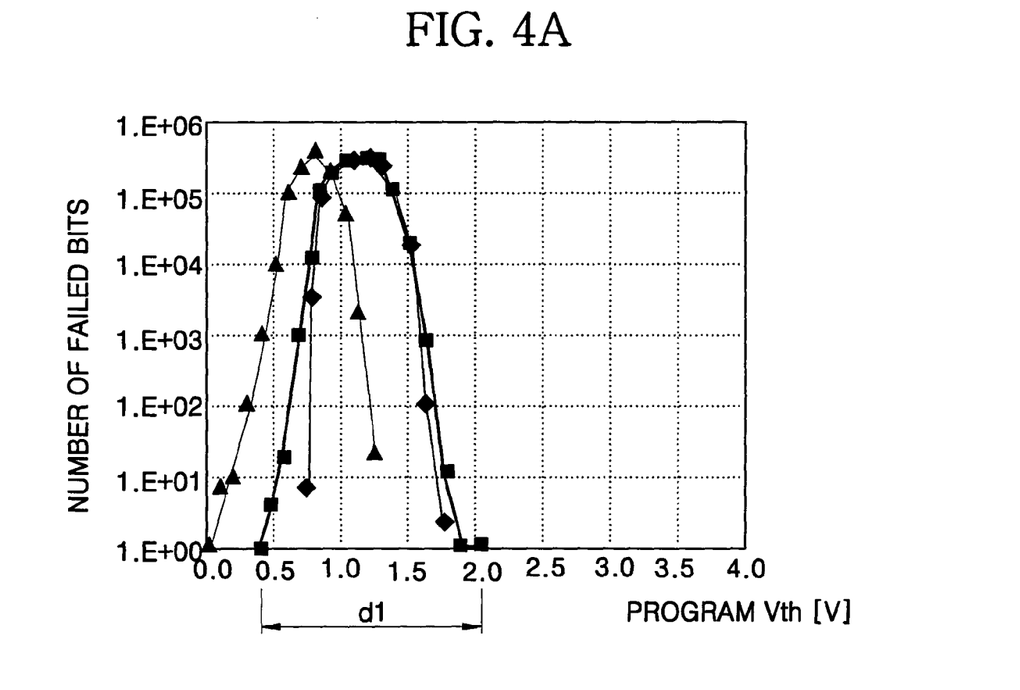
FIGS. 4A and 4B are graphs showing bake retention characteristics of non-volatile memory devices manufactured by the first conventional method and an embodiment of the invention, respectively.
Figure 4B:
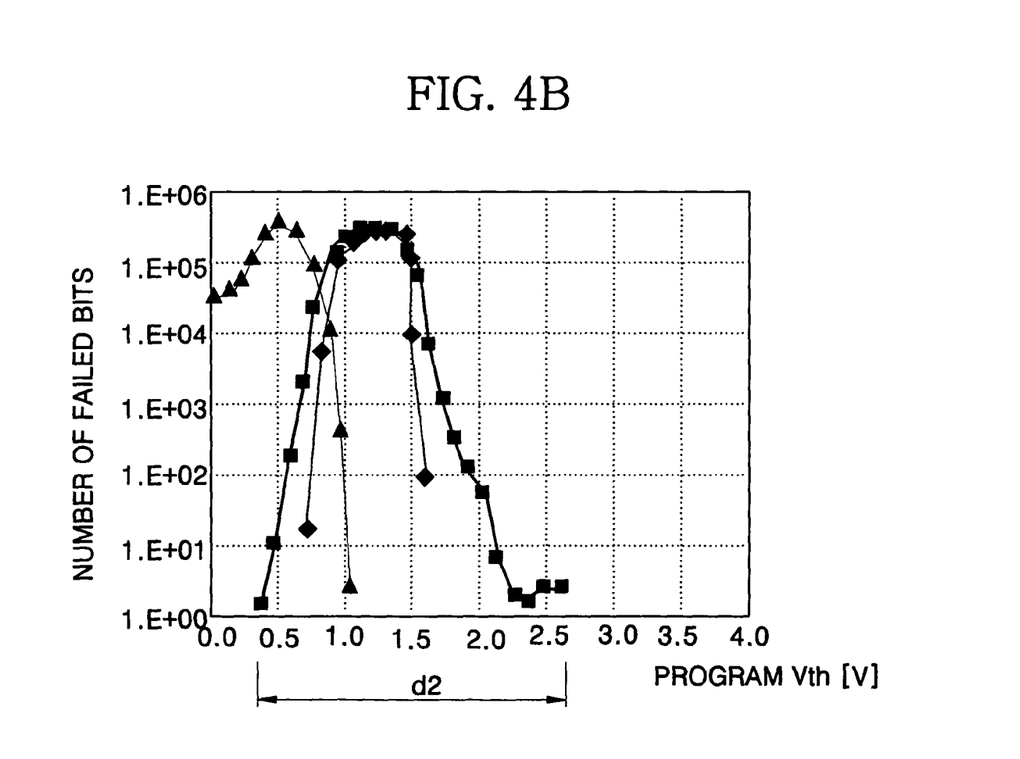

FIGS. 4A and 4B are graphs showing the bake retention characteristics of non-volatile memory devices manufactured by the first conventional method and an embodiment of the invention, respectively. The horizontal axis represents a program threshold voltage Vth and the vertical axis represents the number of failed bits. In the drawings, a symbol ♦ shows the variation of the program threshold voltage Vth with respect to the program-erase operation after 1 cycle. A symbol ■ shows the variation of the program threshold voltage Vth with respect to the program-erase operation after 10,000 cycles. A symbol ▲ shows the variation of the program threshold voltage Vth after the baking process.

Referring to FIGS. 4A and 4B, the distribution of the program threshold voltage Vth for the first conventional method is about 1.5V (d1), while the distribution of the program Vth for the embodiment of the invention is about 1 V (d2). Accordingly, the thickness variation of the ONO layer is decreased to improve the bake retention characteristic, because no phase transformation of the control gate polysilicon layer occurs during the subsequent gate oxidation in the method of forming the control gate.

Figure 5A:
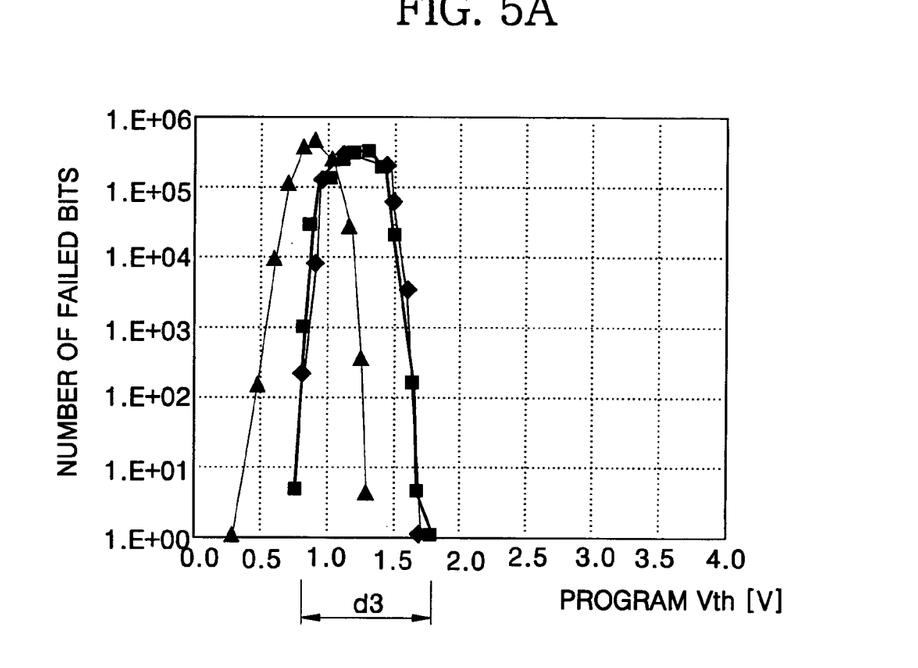
FIGS. 5A and 5B are graphs showing endurance characteristics of non-volatile memory devices manufactured by the first conventional method and an embodiment of the invention, respectively.
Figure 5B:
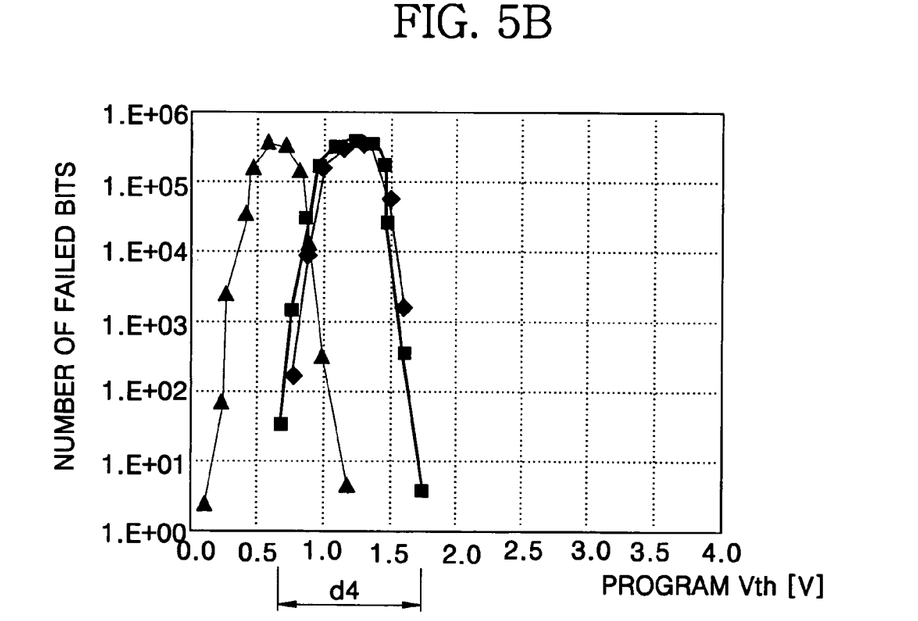

FIGS. 5A and 5B are graphs showing the endurance characteristics of non-volatile memory devices manufactured by the first conventional method and an embodiment of the invention, respectively. The horizontal axis represents a program threshold voltage Vth and the vertical axis represents the number of failed bits. In the graphs, a symbol ♦ shows the variation of the program threshold voltage Vth with respect to the program-erase operation after 1 cycle. A symbol ■ shows the variation of the program threshold voltage Vth with respect to the program-erase operation after 10,000 cycles. A symbol ▲ shows the variation of the program threshold voltage Vth after the baking process.

Referring to FIGS. 5A and 5B, the distribution of the program threshold voltage Vth for the first conventional method is about 2V (d3) and increased to about 0.5V as compared to the 10K program-erase cycles. On the contrary, the distribution of the program threshold voltage Vth for the embodiment of the invention was about 1V (d4), similar to that of 10K program-erase cycles.

Accordingly, the reliability of the ONO layer is improved and the endurance characteristic is also improved because no phase transformation occurs in the control gate silicon layer during the subsequent gate oxidation.

In summary, according to an embodiment of the present invention, an in-situ doped silicon film is deposited on a semiconductor substrate to form a control gate layer thereon. An annealing process is subsequently performed on the resulting structure. Therefore, the doping level of the control gate layer can be easily controlled, thus suppressing a depletion layer in a silicon film. Thus, the program speed can be increased.

Furthermore, because the gate patterning and the gate oxidation process are performed after the initially deposited in-situ doped amorphous silicon film is phase-transformed into the crystalline phase, i.e., crystallized, by annealing, the phase transformation of the silicon film does not occur during the subsequent gate oxidation process, thereby reducing the thickness variation of the ONO layer. Accordingly, the reliability of the ONO layer can be enhanced and the endurance and bake retention characteristics can be improved.

Although preferred embodiments of the invention have been described, it is understood that the invention should not be limited to these preferred embodiments but various changes and modifications can be made by one skilled in the art within the spirit and scope of the invention as hereinafter claimed.

What is claimed is:

1. A method of forming a gate in a non-volatile memory device comprising:
    forming a tunnel dielectric layer on a semiconductor substrate;
    forming a floating gate layer on the tunnel dielectric layer;
    forming an intergate dielectric layer on the floating gate layer;
    forming a control gate layer comprising an in-situ doped amorphous silicon layer on the intergate dielectric layer;
    forming a metal silicide layer on the control gate layer;
    crystallizing the amorphous silicon layer by annealing the control gate layer after forming the metal silicide layer; and
    patterning the control gate layer, the intergate dielectric layer, the floating gate layer, and the metal silicide layer.

2. The method as claimed in claim 1, wherein forming a floating gate layer comprises forming polysilicon.

3. The method as claimed in claim 2, wherein forming a floating gate layer comprises forming amorphous silicon.

4. The method as claimed in claim 1, wherein the intergate dielectric layer comprises an oxide/nitride/oxide (ONO) film.

5. The method as claimed in claim 1, wherein annealing the control gate layer comprises furnace annealing.

6. The method as claimed in claim 5, wherein the furnace annealing is performed at a temperature of about 600~950° C.

7. The method as claimed in claim 1, wherein annealing the control gate layer comprises rapid thermal annealing (RTA).

8. The method as claimed in claim 7, wherein the RTA is performed at a temperature of about 800~1,000° C.

9. A method of forming a gate in a non-volatile memory device, the method comprising:
    forming a tunnel dielectric layer on a semiconductor substrate;
    forming a floating gate layer on the tunnel dielectric layer;
    forming an oxide-nitride-oxide (ONO) intergate dielectric layer on the floating gate layer;
    forming a second silicon layer as a control gate layer on the ONO layer;
    forming a metal suicide layer on the second silicon layer;
    reducing a thickness variation of the ONO layer and a bird's beak phenomenon at the interface between the ONO layer and the second silicon layer by annealing the resultant structure; and
    sequentially patterning the metal silicide layer, the control gate layer, the ONO layer and the floating gate layer,
    wherein the resultant structure is annealed after forming the metal silicide layer.

10. The method of claim 9, wherein the annealing is performed in an ambient including an inert gas.

11. The method of claim 9, wherein forming the metal silicide layer comprises using dichlorosilane gas to form a tungsten silicide layer.

* * * * *

UNITED STATES PATENT AND TRADEMARK OFFICE
CERTIFICATE OF CORRECTION

PATENT NO. : 7,008,844 B2 Page 1 of 1
APPLICATION NO. : 10/635969
DATED : March 7, 2006
INVENTOR(S) : Kim et al.

It is certified that error appears in the above-identified patent and that said Letters Patent is hereby corrected as shown below:

At column 5, line 40, please replace "●" with -- ⬡ --.

Signed and Sealed this

Sixth Day of February, 2007

JON W. DUDAS
*Director of the United States Patent and Trademark Office*